United States Patent
Valle et al.

(10) Patent No.: US 10,333,538 B1
(45) Date of Patent: Jun. 25, 2019

(54) TIME INTERLEAVED ADC ADAPTIVE FILTERING

(71) Applicant: STMICROELECTRONICS S.r.l., Agrate Brianza (IT)

(72) Inventors: Stefano Valle, Milan (IT); Edoardo Lauri, Settimo Milanese (IT); Angelo Poloni, Fino del Monte (IT)

(73) Assignee: STMICROELECTRONICS S.R.L., Agrate Brianza ( * ) Notice: Subject to any disclaimer, the term of this patent is extended or adjusted under 35 U.S.C. 154(b) by 0 days.

(21) Appl. No.: 16/004,192

(22) Filed: Jun. 8, 2018

(51) Int. Cl.
  *H03H 7/30* (2006.01)
  *H03M 1/06* (2006.01)
  *H03H 17/04* (2006.01)
  *H04L 25/03* (2006.01)

(52) U.S. Cl.
  CPC .......... *H03M 1/0626* (2013.01); *H03H 17/04* (2013.01); *H04L 25/03025* (2013.01)

(58) Field of Classification Search
  CPC . H03M 1/0626; H04L 25/03025; H03H 17/04
  USPC ........ 375/232, 227, 295, 316, 346; 341/118, 341/120, 159, 155, 141
  See application file for complete search history.

(56) References Cited

U.S. PATENT DOCUMENTS

| | | | | |
|---|---|---|---|---|
| 5,239,299 A | * | 8/1993 | Apple | ..................... H03M 1/06 341/118 |
| 6,836,235 B2 | * | 12/2004 | Asami | ................ G01R 19/2509 341/118 |

OTHER PUBLICATIONS

Bae et al., "Session 3 Overview: Ultra-High-Speed Wireline Transceivers and Energy-Efficient Links," *IEEE International Solid-State Circuits Conference*, San Francisco, California, USA, Jan. 31-Feb. 4, 2016, pp. 54-70. (23 pages).

(Continued)

*Primary Examiner* — Dhaval V Patel
(74) *Attorney, Agent, or Firm* — Seed IP Law Group LLP (57) ABSTRACT

The present disclosure is directed to a method and system for compensating mismatches among sub-converters in a time interleaved analog digital converter structure. A digital finite impulse response (FIR) equalization filtering unit is coupled to outputs of the sub-converters. The FIR filtering unit includes a digital FIR filter dedicated to each sub-converter. The FIR filtering coefficient is adapted specifically for each sub-converter to achieve a compensation for sub-converter mismatches and inter-symbol interference (ISI) equalization.

17 Claims, 9 Drawing Sheets

(56) References Cited

OTHER PUBLICATIONS

El-Chammas et al., "General Analysis on the Impact of Phase-Skew in Time-Interleaved ADCs," *IEEE Transactions on Circuits and Systems-I: Regular Papers* 56(5):902-910, 2009.
Frost, III, "An Algorithm for Linearly Constrained Adaptive Array Processing," *Proceedings of the IEEE* 60(8):926-935, 1972.
Mellitz, "Backplane Channels: BGA ball to BGA ball with manufacturing considerations," IEEE 50 GE & NGOATH Study Group, presented Feb. 17, 2016, 6 pages.
Roth et al., "50 Gb/s Ethernet Study Group Ad hoc Area and Next Generation 100 Gb/s and 200 Gb/s Ethernet Ad hoc Area," Contributed Channel Data, updated Feb. 18, 2016, URL=http://www.ieee802.org/3/50G/public/channel/index.html, download date Sep. 22, 2017, 2 pages.
Roth, "Sample Cable Data for 50 Gbps Ethernet," Jan. 2015, IEEE 50 GE & NGOATH Study Group, presented Jan. 20, 2016, 71 pages.
Stepanovic, "Calibration Techniques for Time-Interleaved SAR A/D Converters," doctoral dissertation, EECS Department, University of California, Berkeley, Technical Report No. UCB/EECS-2012-225, 2012, 116 pages.

* cited by examiner

TIME INTERLEAVED ADC ADAPTIVE FILTERING

BACKGROUND

Technical Field

The present disclosure relates to a time interleaved analog-to-digital converter (ADC) and to an adaptive filtering technique of a time interleaved analog-to-digital converter.

Description of the Related Art

Time interleaved analog-digital converters (TI ADC) have been developed in the context of high speed interfaces, such as serial/deserializers (SerDes), in communication applications. A TI ADC is normally placed close to the radio frequency (RF) components and is used to provide high sampling rate and high resolution to digitize the high speed SerDes signals or RF signals. The speed demand over band limited channels, such as board and backplane traces, is such that two level analog transceivers are no longer sufficient to sustain the Inter Symbolic Interference (ISI) and digital based transceivers in conjunction with multilevel modulations will gradually replace the analog ones. The TI ADC is a typical structure used in this case to address a high sampling rate, e.g., tens of gigasamples per second, and a relatively high number of bits per sample, e.g., 8 or 10 bits. In a TI ADC, a large number N of ADC circuits ("sub-converters") are used to sample the signal at N equally spaced time instants, so that the sampling rate of each ADC is reduced by a factor of N. The overall sampling quality deteriorates as the bank of sub-converters presents mismatching between/among ADC instances.

Figure 1:
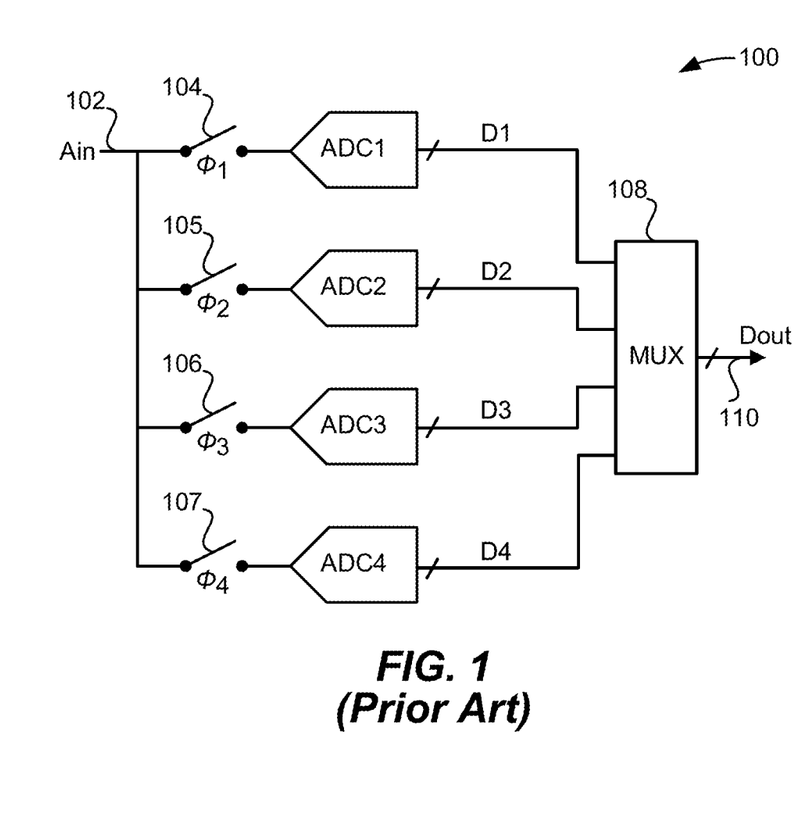
FIG. 1 illustrates an example conventional interleaved ADC.

FIG. 1 illustrates an example time interleaved ADC comprising four sub-converters ADC1 to ADC4. Each of the sub-converters is coupled to an input line 102 via a corresponding switch 104 to 107 controlled by a respective timing signal $\phi1$ to $\phi4$ having respective phase offsets. Thus each one of sub-converters ADC1 to ADC4 samples an analog input signal $A_{in}$ on the input line 102 at a different time, and provides a corresponding output signal (referred to herein as "ADC instance") D1 to D4 to a corresponding input of plural inputs of a multiplexer (MUX) 108. Multiplexer 108 generates an output data signal $D_{out}$ on a line 110 by periodically selecting each of the output signals D1 to D4 in turn. Thus, by providing the four time-interleaved sub-converters ADC1 to ADC4, the input signal $A_{in}$ can be sampled at four times the rate of a single ADC, and thus the sampling frequency $F_s$ can be four times as high.

The use of a time interleaved ADC enables the analog-to-digital conversion be performed at very high speed. On the other hand, because the signal is sampled sequentially by different sub-converters, many unwanted effect are introduced. In particular, the multiple sub-converters suffer from offset, gain and skew mismatches, i.e., samples taken by different sub-converters will suffer from different mismatches. Solutions have been adopted to calibrate each sub-converter to try resolving the mismatch issues. Analog calibration structures are costly and might be limited themselves by process mismatches and thermal or aging drifts. For each mismatch a different calibration structure and procedure would be needed.

BRIEF SUMMARY

The current technique solves the TI ADC sub-converter calibration tasks in the digital domain where highly precise structures and self-adaptive and process-independent mechanisms can be easily implemented. The technique uses a digital finite impulse response (FIR) equalization filtering unit coupled to outputs of the ADC instances, referred to herein as "sub-converters", in a TI ADC device. The FIR filtering unit includes a different digital FIR sub-filter for each sub-converter of the TI ADC device. Namely, the FIR filtering coefficients are adapted specifically for each sub-converter to achieve a compensation for sub-converter mismatches and inter-symbol interference (ISI) equalization. Hence the present technique addresses the mismatch problem by compensating the mismatches in the digital domain rather than trying to calibrate every sub-converter to make them as much similar as possible to one another.

For high speed implementation, e.g., tens of gigasamples per second, digital FIR processing may be instantiated multiple times to operate in parallel and deliver processed samples at the desired speed. The current technique instantiates a FIR sub-filter for each ADC instance, i.e., each sampling taken and processed by a sub-converter is filtered using FIR filtering coefficients adapted specifically for the respective sub-converter. The FIR filter will produce N outputs, with N being the number of sub-converters that sample the analog signal, which are provided to a multiplexer that recreates the equalized stream at the nominal data rate. In the current technique, gain and timing skew mismatches are compensated by adapting the filtering coefficients of each FIR filtering taps of each sub-filter specifically with respect to the respective sub-converter via recursive least mean squares (LMS) adaptation process. That is, the FIR filter includes multiple separate sets of FIR filtering coefficients, each set specifically adapted for each sub-converter. So, the FIR filter includes multiple filters (referred to as "sub-filters"), namely, multiple sets of filtering coefficients. Within each set of filtering coefficients, a specific filtering coefficient of a filtering tap is adapted to apply to sampling instance of a specific sub-converter. Gain mismatch compensation is achieved through a combination of weighted average gain correction and sub-converter specific mismatch compensation. Timing skew compensation is achieved by sub-converter specific mismatch compensation.

According to one embodiment, a sub-filter for a sub-converter includes two groups of filtering coefficients. A filtering coefficient in the first group is determined based on a time domain error(s) associated with the specific sub-converter only. The time domain error ("error") is defined as the difference between the filter output level and the corresponding detector decision level. The detection is obtained through any suitable approaches, none of which limits the scope of the disclosure. A filtering coefficient in the second group is determined based on the error(s) associated with the specific sub-converter only and based on a weighted average of the time domain errors associated with all sub-converters that sample an analog signal.

BRIEF DESCRIPTION OF THE SEVERAL VIEWS OF THE DRAWINGS

The foregoing and other purposes, features, aspects and advantages of embodiments of the present disclosure will become apparent from the following detailed description of embodiments, given by way of illustration and not limitation with reference to the accompanying drawings, in which.

DETAILED DESCRIPTION

Throughout the following description, only those elements useful for an understanding of the various embodiments will be described in detail. Other aspects, such as the particular type and form of the analog to digital converter circuitry implementations, have not been described in detail. The following embodiments applying to a wide range of converter types, such as pipeline converters or successive approximation register (SAR) ADCs.

Figure 2:
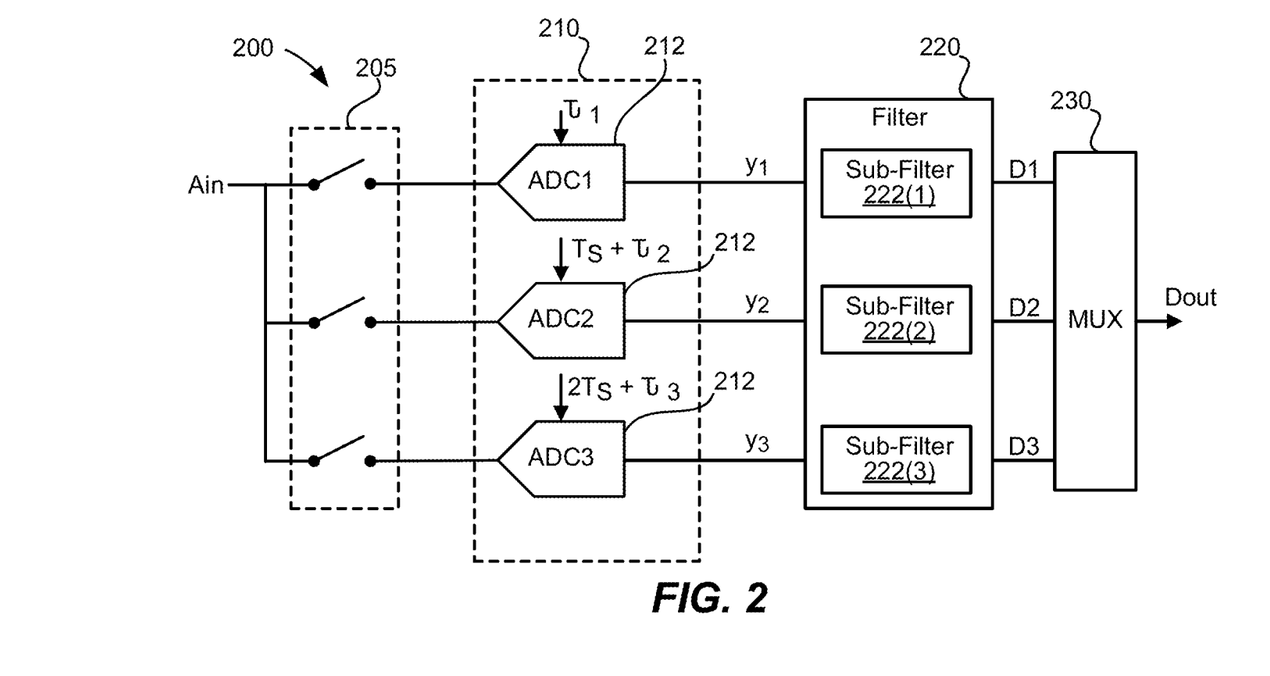
FIG. 2 illustrates an ADC converting device according to an example embodiment of the present disclosure.

FIG. 2 illustrates time interleaved ADC device 200 according to one embodiment. As an illustrative example, the TI ADC 200 includes a switch circuit 205, a converter block 210 that includes multiple sub-converters 212, three ($ADC_1$, $ADC_2$, $ADC_3$) shown as an illustrative example, each coupled to an analog input terminal $A_{in}$ through the switch circuit 205. Sub-converters 212 operate to sequentially sample an analog input signal at input terminal $A_{in}$, with a time interval $T_s$ through the timing control of the switch circuit 205. Note that switch circuit 205 may include multiple switches for the multiple sub-converters 212 or may include a single switch configured to sequentially connect each sub-converter 212 to the analog input terminal $A_{in}$, which are all included in the disclosure. Sub-converters 212 then process the analog samplings into ADC instance digital outputs y ($y_1$, $y_2$, $y_3$). The digital outputs $y_1$, $y_2$, $y_3$ of sub-converters $ADC_1$, $ADC_2$, $ADC_3$ are then processed by a finite impulse response (FIR) digital filter unit 220 before entering a multiplexer (MUX) 230. As appreciated, digital outputs $y_1$, $y_2$, $y_3$ are affected by mismatches among sub-converters 212 in respective gains $G_1$, $G_2$, $G_3$, offsets $O_1$, $O_2$, $O_3$, and timing skews $\tau_1$, $\tau_2$, $\tau_3$ ($T_s$ is sampling interval). FIR digital filter unit 220 includes separate sub-filters 222(1), 222(2) and 222(3) shown as illustrative examples, for each sub-converter 212, namely the FIR filtering coefficients of FIR filter unit 220 include multiple separate sets of FIR filtering coefficients for the multiple sub-converters 212, each set dedicated to and specifically adapted for each sub-converter 212, $ADC_1$, $ADC_2$, $ADC_3$.

Figure 3:
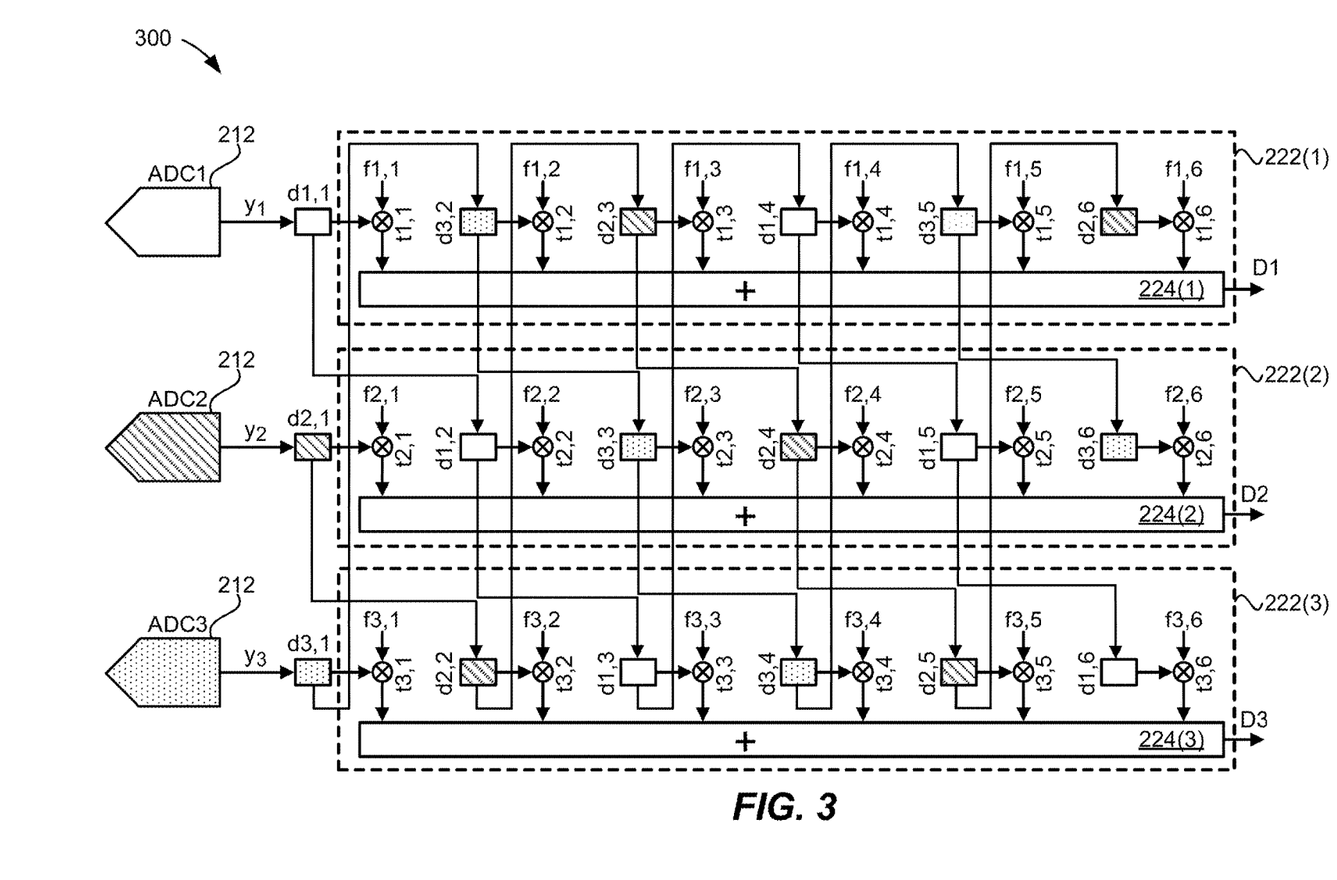
FIG. 3 illustrates an example allocation of FIR filtering coefficient according to an example embodiment of the present disclosure.

FIG. 3 illustrates example FIR filtering operation architecture 300 of the FIR digital filter unit 220. Referring to FIG. 3, in the example FIR architecture 300, three sub-filters 222(1), 222(2) and 222(3) are each dedicated to the respective sub-converter 212, in the sense that each sub-filter 222(1), 222(2) and 222(3) receives the current sampling instance only from the respective sub-converter 212. Each sub-filter 222(1), 222(2) and 222(3) also receive sampling instances prior to the current sampling instance of the respective sub-converter 212 and have filtering coefficients for the previous sampling instances. The previous sampling instances include sampling instances obtained by multiple sub-converters 2121 at different sampling time points. Each filtering coefficient of a sub-filter other filtering 222(1), 222(2) and 222(3) is specifically adapted to be applied to a sampling instance obtained by a specific respective sub-converter 212. Specifically, sub-filter 222(1) is dedicated to sub-converter $ADC_1$, sub-filter 222(2) is dedicated to sub-converter $ADC_2$ and sub-filter 222(3) is dedicated to sub-converter $ADC_3$. It should be appreciated that each sub-filter 222(1), 222(2) and 222(3) is not necessarily a separate filter unit and may just refer to a separate set of filtering coefficients dedicated to filtering the digital output $y_1$, $y_2$, $y_3$ of a specific sub-converter 212. Each sub-filter 222(1), 222(2) and 222(3) may include multiple filtering terms (taps) each with its own filtering coefficient. In an example, at each filtering tap of a sub-filter 222(1), 222(2), 222(3), a delayed digital sampling value of the digital output $y_1$, $y_2$, $y_3$ is combined, e.g., multiplied, with the respective filtering coefficient to generate a filtering product. The filtering products of the multiple filtering taps of the respective sub-filter 222(1), 222(2), 222(3) are combined, e.g., added, in the respective adder 224(1), 224(2), 224(3) to generate the respective filtering results D1, D2, D3.

Note that the filtering coefficient for a filtering tap of a sub-filter 222(1), 222(2) and 222(3) is specifically adapted for the respective sub-converter 212. As shown in FIG. 3 as an illustrative example, sub-filter 222(1) includes filtering coefficient $f_{1,1}$, $f_{1,2}$, $f_{1,3}$, $f_{1,4}$, $f_{1,5}$, $f_{1,6}$ for the six filtering taps $t_{1,1}$, $t_{1,2}$, $t_{1,3}$, $t_{1,4}$, $t_{1,6}$. Sub-filter 222(2) includes filtering coefficient $f_{2,1}$, $f_{2,2}$, $f_{2,3}$, $f_{2,4}$, $f_{2,5}$, $f_{2,6}$ for their respective filtering taps $t_{2,1}$, $t_{2,2}$, $t_{2,3}$, $t_{2,4}$, $t_{2,5}$, $t_{2,6}$ and sub-filter 222(3) includes filtering coefficient $f_{3,1}$, $f_{3,2}$, $f_{3,3}$, $f_{3,4}$, $f_{3,5}$, $f_{3,6}$ for their respective filtering taps $t_{3,1}$, $t_{3,2}$, $t_{3,3}$, $t_{3,5}$, $t_{3,6}$. For example, the filtering coefficient $f_{1,1}$ for the first filtering tap $t_{1,1}$ of sub-filter 222(1) is different from the filtering coefficient $f_{2,1}$ for the first filtering tap $t_{2,1}$ of sub-filter 222(2).

Among the filtering taps of each sub-filter 222(1), 222(2), 222(3), the respective first filtering taps, $t_{1,1}$, $t_{2,1}$, $t_{3,1}$, apply to a current digital sampling $y_1$, $y_2$, $y_3$, and the rest filtering taps, e.g., $t_{1,2}$, $t_{1,3}$, $t_{1,4}$, $t_{1,5}$, $t_{1,6}$ of sub-filter 222(1), apply to some previous digital samplings obtained by the three sub-converters 212, namely "delayed digital samplings". In the description herein, a current digital sampling is also referred to as a "delayed digital sampling" in a general sense. As illustratively shown in FIG. 2, sub-converters $ADC_1$, $ADC_2$ and $ADC_3$ sequentially sample analog input $A_{in}$ in the listed order. In FIG. 3, for descriptive purposes, delayed digital samplings of a sub-converter $ADC_1$, $ADC_2$, $ADC_3$ are referred to a $d_{x,y}$, where x indicate the sub-converter and y indicates the delay position of the digital sampling in the overall sequence of the sampling by all the sub-converters 212. Note that the three sub-converters $ADC_1$, $ADC_2$, $ADC_3$ sequentially sample the input $A_{in}$. For example, sub-converter $ADC_1$ includes sampling instances $d_{1,2}$, $d_{1,3}$, $d_{1,4}$, $d_{1,5}$, $d_{1,6}$, where $d_{1,1}$ is the current digital sampling. After $ADC_1$, the second sub-converter $ADC_2$ sequentially obtains its current digital sampling, the previously digital sampling $d_{1,1}$ will become $d_{1,2}$, indicting its second delay position in the overall sampling sequence; after $ADC_2$, the third sub-converter $ADC_3$ sequentially obtains its current digital sampling, the digital sampling $d_{1,2}$ will become $d_{1,3}$, i.e., in the third delay position in the overall sampling sequence; after $ADC_3$, the first sub-converter $ADC_1$ sequentially obtains its new current digital sampling, i.e., a new $d_{1,1}$, the previously digital sampling $d_{1,3}$ will become $d_{1,4}$, i.e., in the fourth delay position in the overall sampling sequence; after $ADC_1$, the second sub-converter $ADC_2$ sequentially obtains its new current digital sampling, the previously digital sampling $d_{1,1}$ will become $d_{1,2}$ and the previously digital sampling $d_{1,4}$ will become $d_{1,5}$, indicating their respective second and fifth delay positions in the overall sampling sequence; and again after $ADC_2$, the third sub-converter $ADC_3$ sequentially obtains its new current digital sampling, the previously digital sampling $d_{1,2}$ will become $d_{1,3}$ and the previously digital sampling $d_{1,5}$ will become $d_{1,6}$, indicating their respective third and sixth delay positions in the overall sampling sequence.

Similarly, delayed digital samplings of sub-converter $ADC_2$ includes $d_{2,1}$, $d_{2,2}$, $d_{2,3}$, $d_{2,4}$, $d_{2,5}$, $d_{2,6}$, where $d_{2,1}$ is the current digital sampling and $d_{2,2}$, $d_{2,3}$, $d_{2,4}$, $d_{2,5}$, $d_{2,6}$ are previous sampling values obtained by sub-converter $ADC_2$ in the overall sampling sequence. Delayed digital samplings of sub-converter $ADC_3$ includes $d_{3,1}$, $d_{3,2}$, $d_{3,3}$, $d_{3,4}$, $d_{3,5}$, $d_{3,6}$, where $d_{3,1}$ is the current digital sampling and $d_{3,2}$, $d_{3,3}$, $d_{3,4}$, $d_{3,5}$, $d_{3,6}$ are previous sampling values of $ADC_3$ in the overall sampling sequence.

As sub-converters $ADC_1$, $ADC_2$ and $ADC_3$ sequentially sample analog input $A_{in}$ in an interleaved manner, the retrospective time sequence (i.e., from present time point to previous time point) includes digital samplings obtained by/from different sub-converters $ADC_1$, $ADC_2$ and $ADC_3$ in an interleaved manner. For example, when sub-converter $ADC_1$ is currently sampling analog input $A_{in}$, the retrospective time sequence is $d_{1,1}$, $d_{3,2}$, $d_{2,3}$, $d_{1,4}$, $d_{3,5}$, $d_{2,6}$, where $d_{1,1}$ is the current sampling among all sub-converter $ADC_1$, $ADC_2$ and $ADC_3$, $d_{3,2}$ is the immediately previous sampling, i.e., one sampling interval $T_s$ before $d_{1,1}$, $d_{2,3}$ is two sampling interval $T_s$ before, $d_{1,4}$ is three sampling interval $T_s$ before, $d_{3,5}$ is four sampling interval $T_s$ before, and $d_{2,6}$ is five sampling interval $T_s$ before. When sub-converter $ADC_2$ is currently sampling analog input $A_{in}$, the retrospective time sequence is $d_{2,1}$, $d_{1,2}$, $d_{3,3}$, $d_{2,4}$, $d_{1,5}$, $d_{3,6}$, where $d_{2,1}$ is the current sampling among all sub-converter $ADC_1$, $ADC_2$ and $ADC_3$. When sub-converter $ADC_3$ is currently sampling analog input $A_{in}$, the retrospective time sequence is $d_{3,1}$, $d_{2,2}$, $d_{1,3}$, $d_{3,4}$, $d_{2,5}$, $d_{1,6}$, where $d_{3,1}$ is the current sampling among all sub-converter $ADC_1$, $ADC_2$ and $ADC_3$.

Filtering taps of each sub-filter 222(1), 222(2), 222(3) apply to the current digital sampling of the respective sub-converter 212, and the retrospective sequence of the delayed digital samplings including the current digital sampling. For example, for sub-filter 222(1), the first filtering tap $t_{1,1}$ applies to the current digital sampling $d_{1,1}$ of sub-converter $ADC_1$, the second filtering tap $t_{1,2}$ applies to the immediately previous digital sampling $d_{3,2}$. And filtering taps $t_{1,3}$, $t_{1,4}$, $t_{1,5}$, $t_{1,6}$ apply to further previous digital samplings $d_{2,3}$, $d_{1,4}$, $d_{3,5}$, $d_{2,6}$, respectively. Similarly, filtering taps $t_{2,1}$, $t_{2,2}$, $t_{2,3}$, $t_{2,4}$, $t_{2,5}$, $t_{2,6}$ of sub-filter 212(2) apply to the retrospective sequence of digital samplings $d_{2,1}$, $d_{1,2}$, $d_{3,3}$, $d_{2,4}$, $d_{1,5}$, $d_{3,6}$, with first filtering tap $t_{2,1}$ applying to digital sampling $d_{2,1}$ of $ADC_2$ as the current digital sampling. Filtering taps $t_{3,1}$, $t_{3,2}$, $t_{3,3}$, $t_{3,4}$, $t_{3,5}$, $t_{3,6}$ of sub-filter 212(3) apply to the retrospective sequence of digital samplings $d_{3,1}$, $d_{2,2}$, $d_{1,3}$, $d_{3,4}$, $d_{2,5}$, $d_{1,6}$, with first filtering tap $t_{3,1}$ applying to digital sampling $d_{3,1}$ of $ADC_3$ as the current digital sampling. Note that, $d_{1,1}$ and $d_{1,2}$, for example, are the same sampling instance obtained sub-converter $ADC_1$, and a current sampling $d_{1,1}$ will become $d_{1,2}$, i.e., second delay position in the overall sampling sequence, when next sampling of analog input $A_{in}$ by sub-converter $ADC_2$ is obtained. In the illustrative example of three sub-converters 212, $d_{1,1}$ and $d_{1,4}$ are the sequential sampling instances obtained by sub-converter $ADC_1$, and $d_{1,4}$ is obtained prior to $d_{1,1}$.

Further, a FIR filtering coefficient of each sub-filter 222(1), 222(2), 222(3) is specifically adapted with respect to the respective sub-converter 212. For example, for the first filtering taps of sub-filters 222(1), 222(2) and 222(3), three separate filtering coefficient $f_{1,1}$, $f_{2,1}$ and $f_{3,1}$ are specifically adapted to be applied to the digital samplings $d_{1,1}$, $d_{2,1}$, $d_{3,1}$ (i.e., the current sampling values of $y_1$, $y_2$, $y_3$) obtained by the sub-converters $ADC_1$, $ADC_2$, $ADC_3$, respectively. Similarly, for the third filtering taps of sub-filters 222(1), 222(2) and 222(3), three different filtering coefficients $f_{1,3}$, $f_{2,3}$ and $f_{3,3}$ are specifically adapted for the sub-converters $ADC_1$, $ADC_2$, $ADC_3$, respectively. Note that different filtering coefficients, e.g., $f_{1,1}$, $f_{2,1}$, are different in the sense that they are adapted differently, which does not necessarily mean that they have different values.

FIG. 3 shows, as an illustrative example, how previous digital samplings are used in the filtering, which does not limit the scope of the disclosure. Other patterns of applying filtering coefficients to delayed digital samplings are also possible and included in the disclosure.

Within each sub-filter 222, the processing results of the respective filtering taps will be combined by respective adders 224(1), 224(2), 224(3), that separately generate the respective filtering results $D_1$, $D_2$, $D_3$.

In an example, the set of filtering coefficients of each sub-filter 222(1), 222(2) and 222(3), i.e., specifically for a respective sub-converter 212, e.g., filtering coefficient $f_{1,1}$, $f_{1,2}$, $f_{1,3}$, $f_{1,4}$, $f_{1,5}$, $f_{1,6}$ of sub-filter 222(1) for sub-converter $ADC_1$, may include a first group of filtering coefficients and a second group of filtering coefficients. For the first group of filtering coefficients of the sub-filter 222, e.g., sub-filter 222(1), the coefficient values are adapted based on the time domain error (referred herein as "error") associated only with the corresponding sub-converter 212, here e.g., $ADC_1$, and errors of other sub-converters 212, here e.g., $ADC_2$ and $ADC_3$, are not factored in. For the second group of filtering coefficients of sub-filter 222(1), the coefficient values are adapted based on the error associated with the corresponding sub-converter 212, here $ADC_1$, and a weighted average of errors of all sub-converters 212, here $ADC_1$, $ADC_2$ and $ADC_3$. In an example, the first group includes more elements than the second group. In an example, the second group includes only the filtering coefficient(s) for the center filtering tap, $t_{1,3}$ and/or $t_{1,4}$, of the sub-filter 222(1) for sub-converter $ADC_1$. In the example six filtering taps of FIG. 3, the second group of filtering coefficient of each sub-filter 222 may include the respective filtering coefficients for the respective center taps, namely one or both of the third filtering tap or the fourth filtering tap of each sub-filter 222, e.g., one or both of $f_{1,3}$ and $f_{1,4}$ of sub-filter 222(1) for sub-converter $ADC_1$.

As the first group of FIR filtering coefficients of each sub-filter 222 are adapted using only the error(s) associated with the respective same sub-converter 212, the skew mismatches among various sub-converters 212 are compensated for. As the second group of FIR filtering coefficients of each sub-filter 222 for the respective sub-converter 212 are adapted using the error(s) associated with the respective sub-converter 212 and a weighted average of errors of all sub-converters 212, the gain mismatches among different sub-converters 212 are effectively compensated for.

According to an example, the second group of FIR filtering coefficients of a sub-filter 222 may be adapted following the below algorithms:

$$\min\{err^2\} = \min\left\{\left(\sum_{i=1}^{L} f_{ni} \cdot y_{ni} - d_n\right)^2\right\}, \quad (1)$$

$$\frac{\sum_{n=1}^{N} f_{nj}}{N} = M_j \text{ constraint}, \quad (2)$$

where, N indicates the number of sub-converters 212, here for the example of FIG. 3, N=3; L indicates the number of filtering taps of a sub-filter 222, here for the example of FIG. 3, L=6; $f_{ni}$ indicates a filtering coefficient of the ith filtering tap of the sub-filter 222 for nth sub-converter 212; $y_{ni}$ indicates the delayed ADC instance input to the ith filtering tap for the nth sub-converter 212, here for the example of FIG. 3, $y_{1,2}$ of the 2nd tap of sub-filter 212(1) for sub-converter $ADC_1$ is the delayed sampling data from $ADC_3$; and $d_n$ indicates the decision output of the sub-filter 222 for the specific sub-nth converter 212, e.g., for example of FIG. 3, $d_1$ is filtered output of sub-converter $ADC_1$.

In the algorithm (2), constant $m_j$ is determined as a constraint on the jth FIR filtering taps within the second group of filtering coefficients for each of the sub-converters 212. This value constraint functions to compensate for the gain mismatches among different sub-converters 212. As provided by algorithm (2), the average value of the jth FIR filtering taps of all the sub-filters 222 respectively for all the sub-converters 212 shall be equal to the constraint value $m_j$.

With the $m_j$ value set, the below algorithms may be used to determine a filtering coefficient in the second group A Lagrange optimization function is:

$$\Lambda(f_{nj}, \lambda) = \left(\sum_{i=1}^{L} f_{ni} \cdot y_{ni} - d_n\right)^2 + \lambda \cdot \left(\left(\frac{\sum_{n=1}^{N} f_{nj}}{N}\right) - m_j\right), \quad (3)$$

With FIR adaptation procedures applied:

$$\frac{\partial \Lambda}{\partial f_{nj}} = 2 \cdot err_n \cdot y_{nj} + \frac{\lambda}{N} = 0, \quad (4)$$

where, n=1, ... N; j=a filtering tap in the second group, for example, the central tap(s). And, $$\frac{\partial \Lambda}{\partial \lambda} = \left(\frac{\sum_{n=1}^{N} f_{nj}}{N}\right) - m_j = 0, \quad (5)$$

With algorithms (3), (4) and (5) applied together, it can be obtained that:

$$\lambda = -\sum_{n=1}^{N} 2 \cdot err_n \cdot y_{nj}, \quad (6)$$

Therefore, a filtering coefficient in the second group might be determined as:

$$f_{nj} = f_{nj} - \gamma \cdot \left(err_n \cdot y_{nj} - \frac{\sum_{n=1}^{N} err_n \cdot y_{nj}}{N}\right), \quad (7)$$

where γ is a constant. Note that in the adaptation of coefficient $f_{nj}$, it is factored in both the error that is associated only to the specific sub-converter 212, i.e., $err_n$ for nth sub-converter 212, and the weighted average of errors of all sub-converters 212, i.e., $(\sum_{n=1}^{N} err_n \cdot y_{nj})/N$.

For the value adaptation of a filtering coefficient in the first group, only the error associated to the specific nth sub-converter 212 is used:

$$f_{ni} = f_{ni} - \gamma \cdot err_n \cdot y_{ni} \text{ where, } n=1, \ldots N, i=1, \ldots L, i \neq j \quad (8)$$

For a filtering coefficient in the second group, the constraint value $m_j$ may be setup as a predetermined value or may be dynamically adapted. In an example, the value $m_j$ may be used as a constraint in the following procedures:

$$f_{nj} = f_{nj} - \gamma(2 \cdot err_n \cdot y_{nj} + \lambda/N) \quad (9),$$

$$\frac{\sum_{n=1}^{N} \left[f_{nj} - \gamma\left(2 \cdot err_n \cdot y_{nj} + \frac{\lambda}{N}\right)\right]}{N} = m_j, \quad (10)$$

$$\sum_{n=1}^{N} f_{nj} - \sum_{n=1}^{N} \gamma(2 \cdot err_n \cdot y_{nj}) - \gamma\lambda = m_j N \quad (11),$$

$$\lambda = \frac{\sum_{n=1}^{N} f_{nj}}{\gamma} - \sum_{n=1}^{N} (2 \cdot err_n \cdot y_{nj}) - \frac{m_j N}{\gamma}, \quad (12)$$

Based on algorithms (9)-(12), an updated FIR coefficient adaptation algorithm could be obtained for a filtering tap in the second group:

$$f_{nj} = f_{nj} - \gamma \cdot err_n \cdot y_{nj} - \left(\frac{\sum_{n=1}^{N} f_{nj}}{N} - m_j - \gamma \cdot \frac{\sum_{n=1}^{N} (2 \cdot err_n \cdot y_{nj})}{N}\right), \quad (13)$$

where n=1, ... N; and where j=a filtering tap in the second group.

With the example algorithm (13) for adapting/determining the FIR filtering coefficient of a filtering tap in the second group of a sub-filter 222, the constraint value $m_j$ may be dynamically adapted to a desired value, which could be different than the initial value. Note that if the term $$\frac{\sum_{n=1}^{N} f_{nj}}{N} - m_j$$

is omitted from algorithm (13), the algorithm (13) becomes the same as algorithm (7) described herein.

In an example, the initial value of $f_{ni}$ in algorithm (8) for a filtering tap in the first group may be set up as "0" and the initial value $f_{nj}$ in algorithm (7) or (13) for a filtering tap in the second group may be set up as "1".

Figure 4:
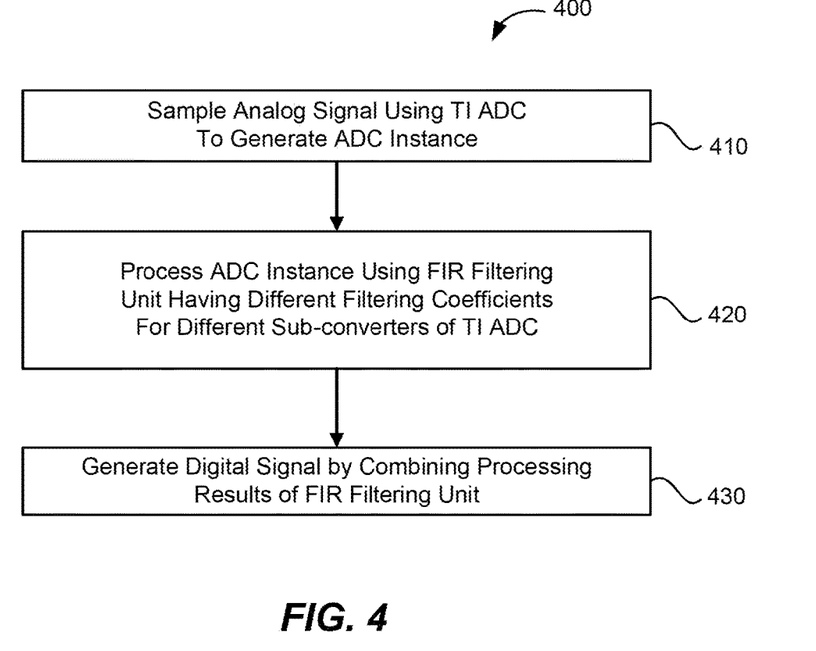
FIG. 4 illustrates an example ADC method process according to an example embodiment of the present disclosure.

FIG. 4 illustrates an example process 400 of converting an analog signal to a digital signal. Referring to FIG. 4, in example operation 410, an analog signal is sampled sequentially by sub-converters 212 of a TI ADC 210 as shown in FIG. 2 as an example embodiment, to generate ADC instance digital outputs ("ADC instances") y, each ADC instance $y_1$, $y_2$, $y_3$ being a digital output of the respective sub-converter 212.

In example operation 420, the ADC instances of the sub-converters 212 are fed into a FIR filtering unit 220 for a digital FIR filtering processing. The digital FIR filtering unit 220 has multiple sub-filters 222 each dedicated to a respective sub-converter 212. A sub-filter 222 includes FIR filtering coefficients specifically adapted for the respective sub-converter 212. Specifically, the filtering coefficients of a sub-filter 222 for a sub-converter 212 includes a first group of filtering coefficients for a first group of filtering taps of the sub-filter 222, which are determined based on errors of the respective sub-converter 212 only and a second group of filtering coefficients for a second group of filtering taps of the sub-filter 222, which are determined based on errors of the respective sub-converter 212 and a weighted average of errors of all the sub-converters 212 that sample the analog signal.

In an example, the filtering coefficients of the first group of filtering taps may be determined using example algorithm (8) described herein. In an example, the filtering coefficients of the second group of filtering taps may be determined using one of example algorithms (7) or (13) described herein.

In example operation 430, the results of the sub-filters 222 of FIR filtering unit 220 are fed into the multiplexer 230 to be combined to generate a digital signal.

FIGS. 5A-5E illustrates the operation of the example process 400 and/or the system 200 using illustrative example samplings.

Figure 5A:
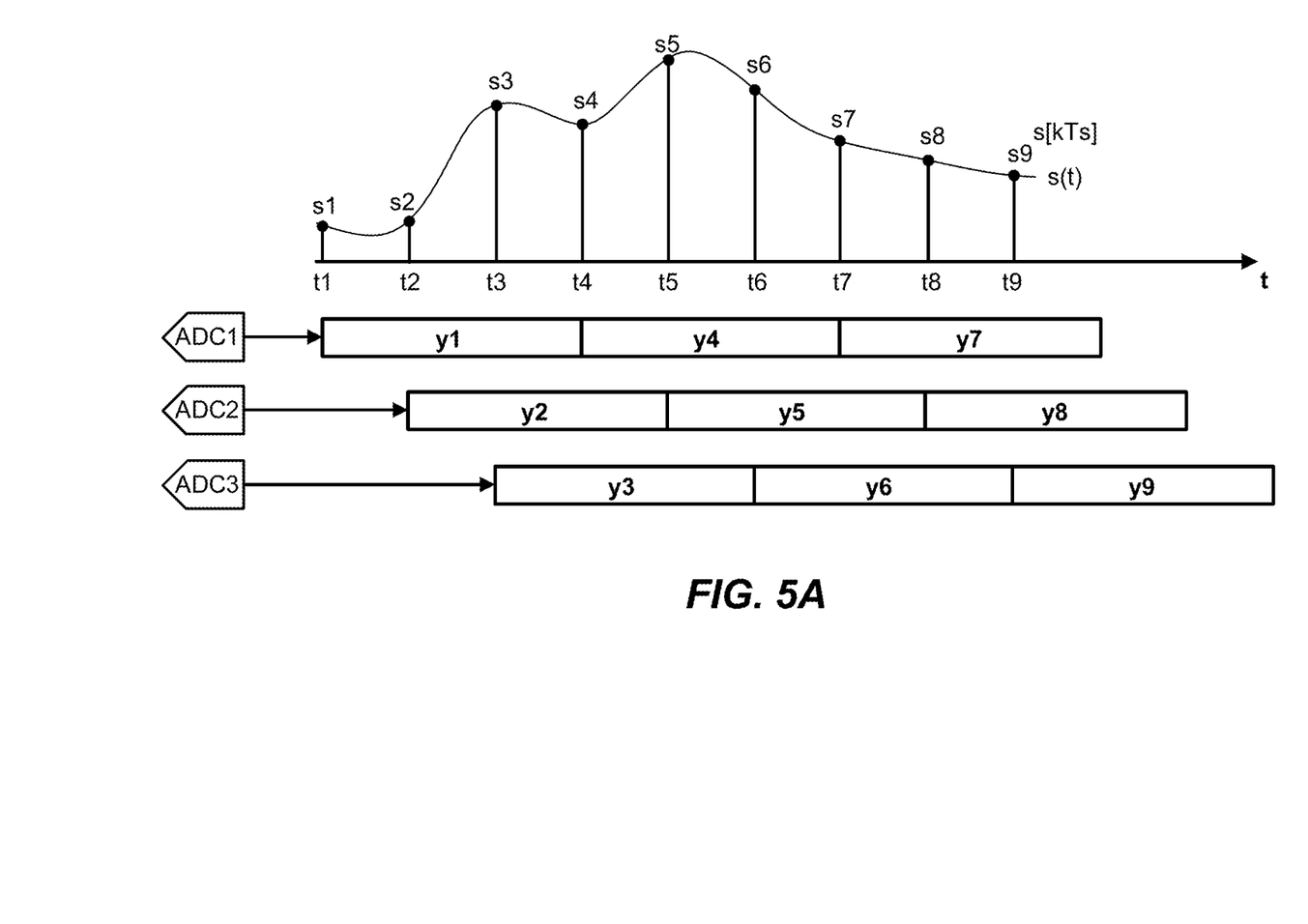
FIGS. 5A-5E illustrate the example ADC method process of FIG. 4 with example ADC sampling instances.

Referring to FIG. 5A, the example ADC samplings are sequential ADC sampling instances $y_1$, $y_2$, $y_3$, $y_4$, $y_5$, $y_6$, $y_7$, $y_8$, $y_9$. The sequential samplings are obtained by multiple sub-converters 212, $ADC_1$, $ADC_2$, $ADC_3$ sequentially. Specifically, $y_1$, $y_4$, $y_7$ are obtained by $ADC_1$, $y_2$, $y_5$, $y_8$ are obtained by $ADC_2$, and $y_3$, $y_6$, $y_9$ are obtained by $ADC_3$. As shown in FIG. 4A, until a new sampling instance $y_4$ is obtained by the sub-converter $ADC_1$, sampling instance $y_1$ is the delay sampling instances that the sub-converter $ADC_1$ provides to the filtering taps of the sub-filters 222(1), 222(2), 222(3) (not specifically shown in FIG. 4A for simplicity). Similarly, until a new sampling instance $y_7$ is obtained by the sub-converter $ADC_1$, sampling instance $y_4$ is the delay sampling instances that the sub-converter $ADC_1$ provides to the filtering taps of the sub-filters 222(1), 222(2), 222(3).

The example sampling instances $y_1$, $y_2$, $y_3$, $y_4$, $y_5$, $y_6$, $y_7$, $y_8$, $y_9$ are obtained at sampling time points $t_1$, $t_2$, $t_3$, $t_4$, $t_5$, $t_6$, $t_7$, $t_8$, $t_9$, respectively.

Figure 5B:
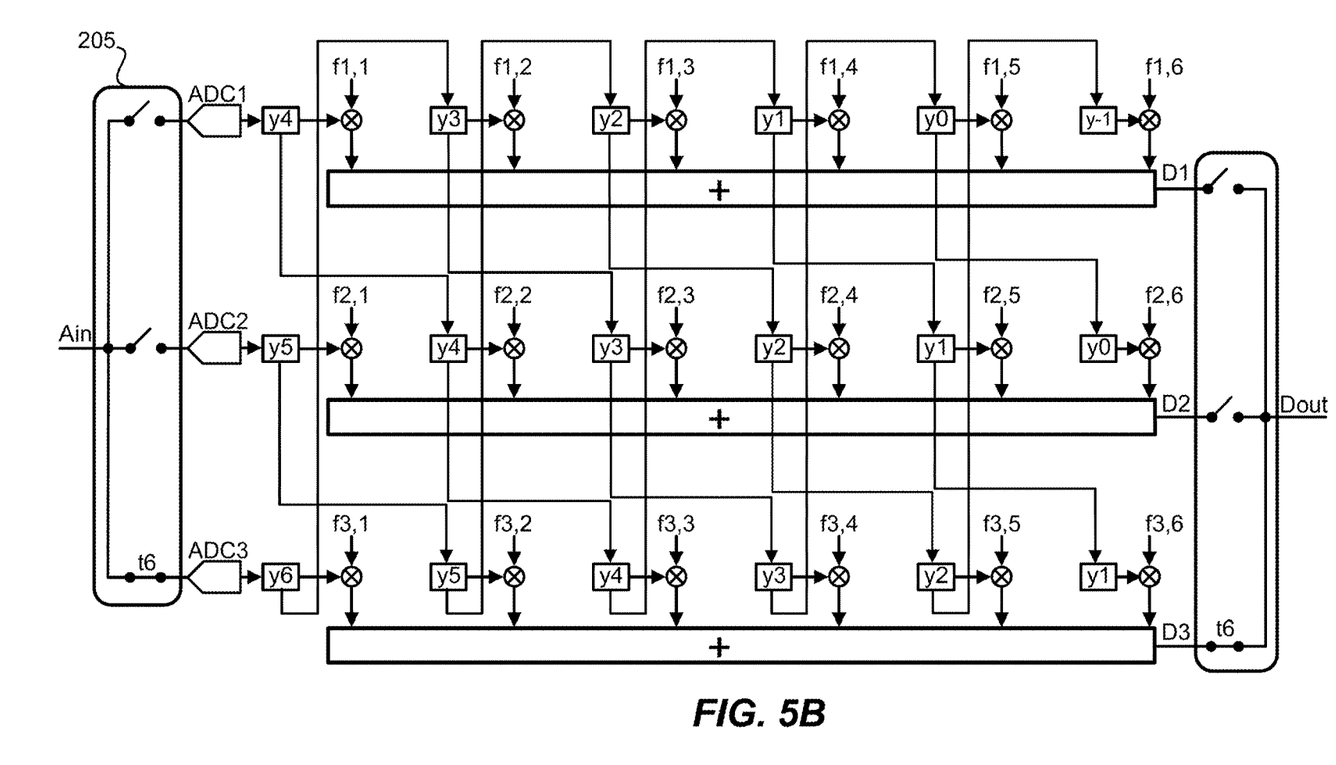

Referring to FIG. 5B, at the time point $t_6$, the current sampling instance $y_6$ is obtained by the sub-converter $ADC_3$ and is fed into the first filtering tap of the respective sub-filter 222(3), which has a filtering coefficient $f_{3,1}$. Previous sampling instances $y_5$, $y_4$, $y_3$, $y_2$, $y_1$ are also received by the sub-filter 222(3) and are processed with the filtering coefficients $f_{3,2}$, $f_{3,3}$, $f_{3,4}$, $f_{3,5}$, $f_{3,6}$ respectively. The result D3 of the sub-filter 222(3) will be output as the digital output $D_{out}$.

Figure 5C:
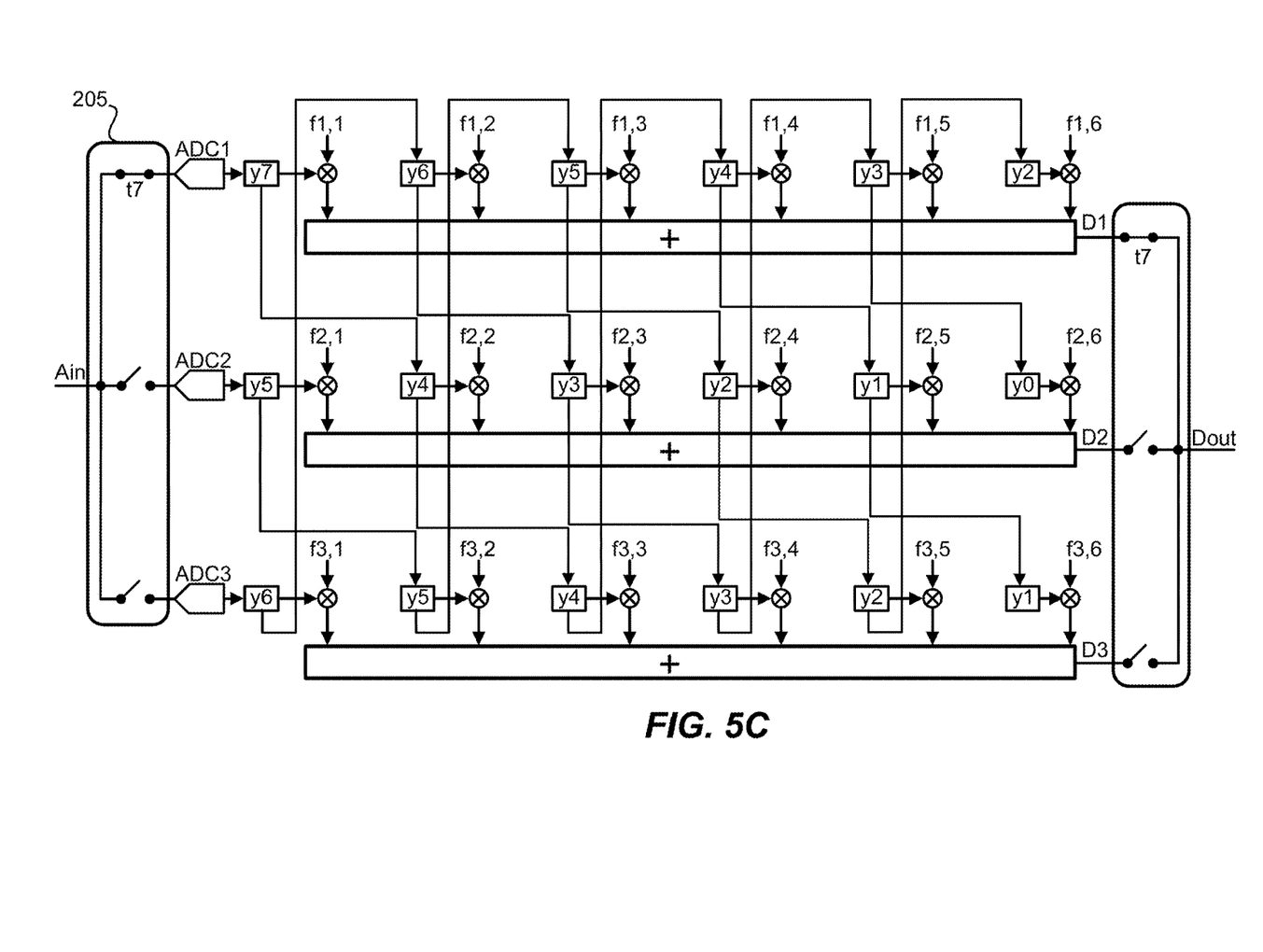

Referring to FIG. 5C, at the time point $t_7$, the current sampling instance $y_7$ is obtained by the sub-converter $ADC_1$ and is fed into the first filtering tap of the respective sub-filter 222(1), which has a filtering coefficient $f_{1,1}$. Sampling instance $y_6$ now becomes a previous sampling instance. Previous sampling instances $y_6$, $y_5$, $y_4$, $y_3$, $y_2$ are also received by the sub-filter 222(1) and are processed with the filtering coefficients $f_{1,2}$, $f_{1,3}$, $f_{1,4}$, $f_{1,5}$, $f_{1,6}$ respectively. The result D1 of the sub-filter 222(1) will be output as the digital output $D_{out}$. FIG. 4C shows that for the sub-filters 222(2) and 222(3), the filtering coefficients are shown as applied to previous sampling instances, which indicates that the procedures in each sub-filters 222 may be conducted partially in parallel with one another.

Figure 5D:
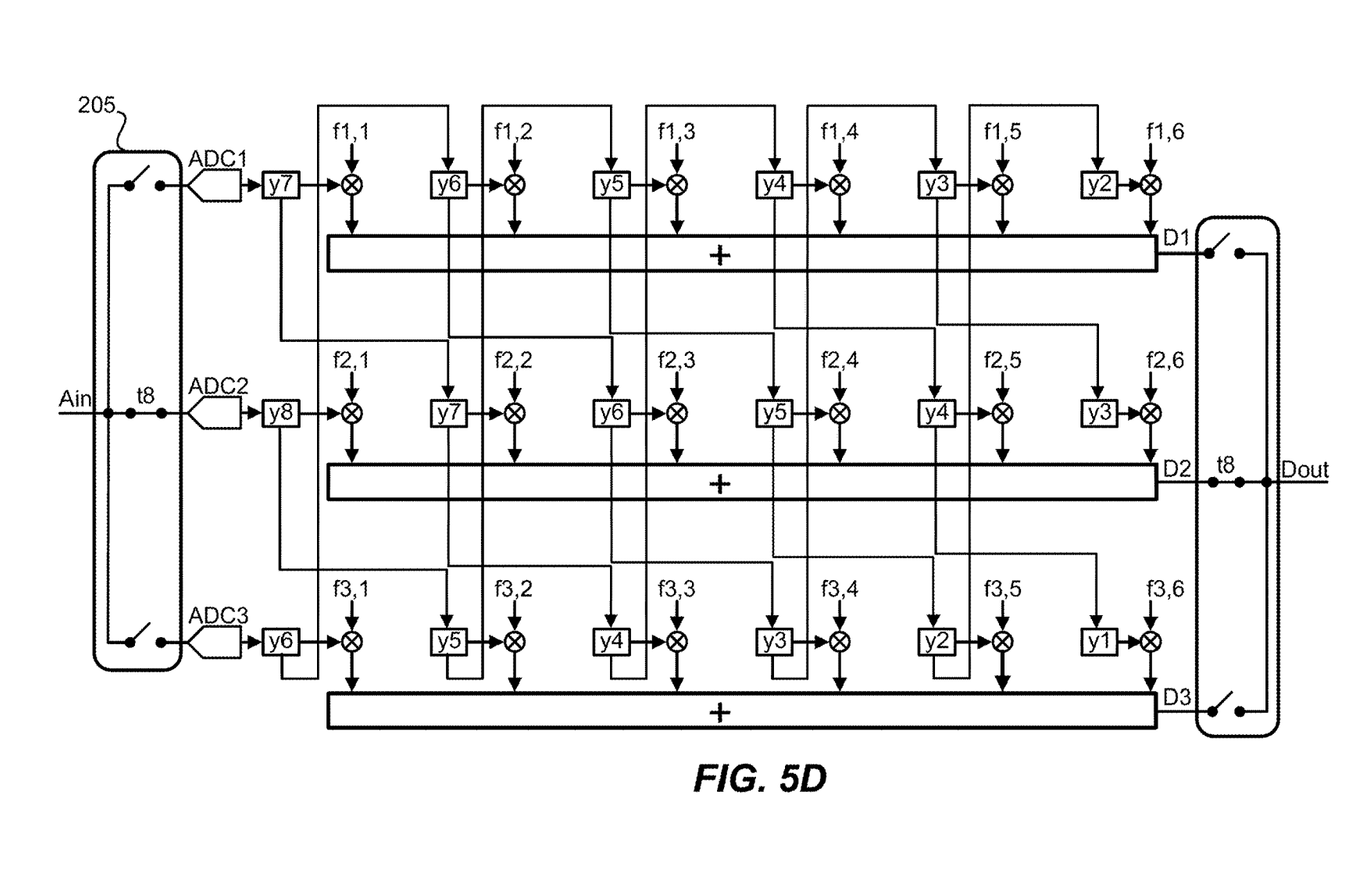

Referring to FIG. 5D, at the time point $t_8$, the current sampling instance $y_8$ is obtained by the sub-converter $ADC_2$ and is fed into the first filtering tap of the respective sub-filter 222(2), which has a filtering coefficient $f_{2,1}$. Sampling instance $y_7$ now becomes a previous sampling instance. Previous sampling instances $y_7$, $y_6$, $y_5$, $y_4$, $y_3$ are also received by the sub-filter 222(2) and are processed with the filtering coefficients $f_{2,2}$, $f_{2,3}$, $f_{2,4}$, $f_{2,5}$, $f_{2,6}$ respectively. The result D2 of the sub-filter 222(1) will be output as the digital output $D_{out}$.

Figure 5E:
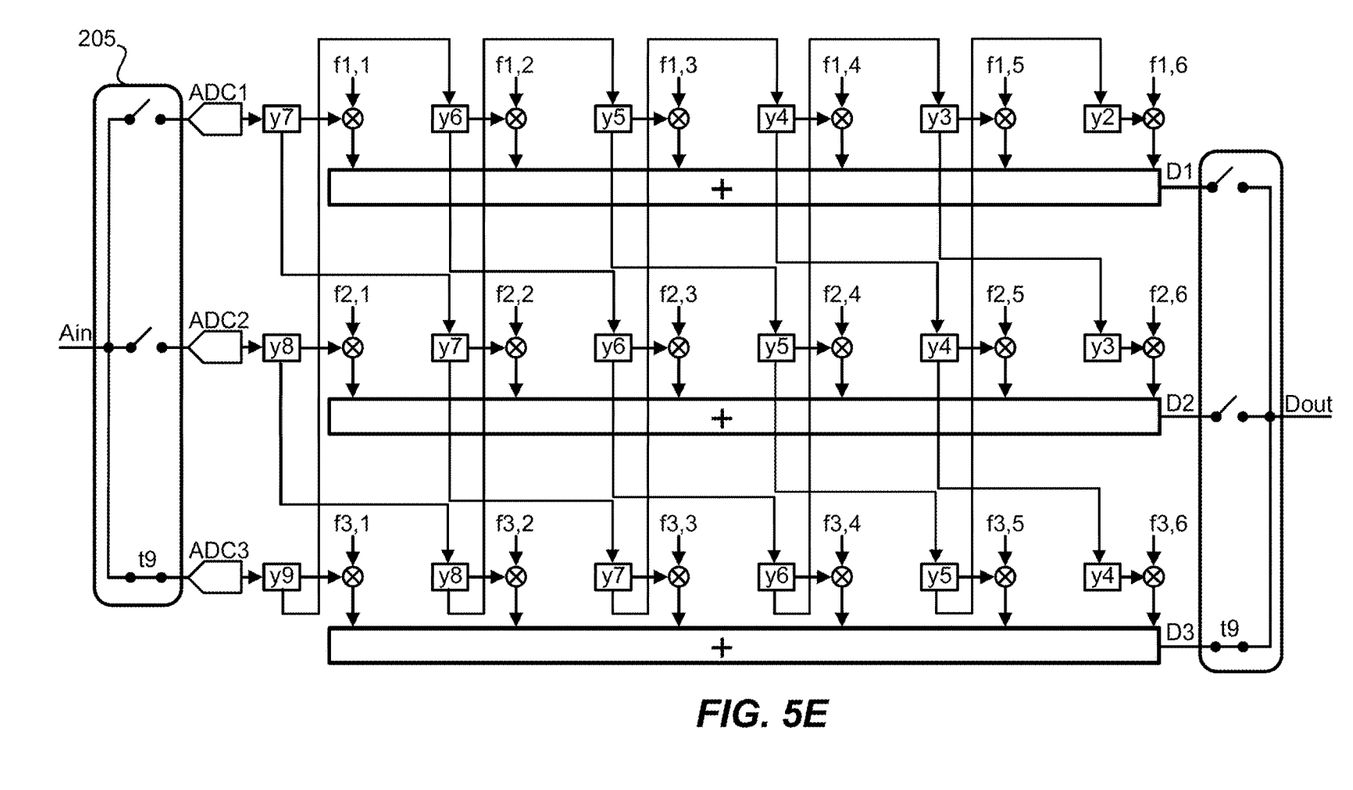

Referring to FIG. 5E, at the time point $t_9$, the current sampling instance $y_9$ is obtained by the sub-converter $ADC_3$ and is fed into the first filtering tap of the respective sub-filter 222(3), which has a filtering coefficient $f_{3,1}$. Sampling instance $y_8$ now becomes a previous sampling instance. Previous sampling instances $y_8$, $y_7$, $y_6$, $y_5$, $y_4$ are also received by the sub-filter 222(3) and are processed with the filtering coefficients $f_{3,2}$, $f_{3,3}$, $f_{3,4}$, $f_{3,5}$, $f_{3,6}$ respectively. The result D3 of the sub-filter 222(3) will be output as the digital output $D_{put}$.

Referring to FIGS. 5B and 5E together, it show that the filtering coefficients $f_{3,1}$, $f_{3,2}$, $f_{3,3}$, $f_{3,4}$, $f_{3,5}$, $f_{3,6}$ of sub-filter 222(3) each is applied to a sampling instance obtained by a respective same sub-converter 212. The first filtering coefficient $f_{3,1}$ is always applied to a current sampling instance obtained by the respective sub-converter $ADC_3$. The second filtering coefficient $f_{3,2}$ is always applied to a delayed sampling instance obtained by the sub-converter $ADC_2$. The third filtering coefficient $f_{3,3}$ is always applied to a delayed sampling instance obtained by the sub-converter $ADC_1$. The fourth filtering coefficient $f_{3,4}$ is always applied to a delayed sampling instance obtained by the sub-converter $ADC_3$. The fifth filtering coefficient $f_{3,5}$ is always applied to a delayed sampling instance obtained by the sub-converter $ADC_2$. The sixed filtering coefficient $f_{3,6}$ is always applied to a delayed sampling instance obtained by the sub-converter $ADC_1$. At the same time, the filtering coefficients $f_{3,1}$, $f_{3,2}$, $f_{3,3}$, $f_{3,4}$, $f_{3,5}$, $f_{3,6}$ are adapted using the time domain error of the respective sub-converter $ADC_3$. Similar descriptions also apply to sub-filters 222(1) and 222(2).

Having thus described at least one illustrative embodiment of the disclosure, various alterations, modifications and improvements will readily occur to those skilled in the art. Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. A device, comprising:
  a time interleaved analog to digital converter (ADC) having:
    an input terminal configured to receive an analog input signal;

a first sub-converter coupled to the input terminal and configured to sample the analog input signal and convert a first set of samples of the analog input signal into a first set of digital output values;
a second sub-converter coupled to the input terminal and configured to sample the analog input signal and convert a second set of samples of the analog input signal into a second set of digital output values; and
a finite impulse response (FIR) digital filtering unit coupled to outputs of the first sub-converter and the second sub-converter, the FIR digital filtering unit having a first set of filtering coefficients of a first set of filtering taps dedicated to the first sub-converter and a second set of filtering coefficients of a second set of filtering taps dedicated to the second sub-converter, a first filtering coefficient of the first set of filtering coefficients being determined based on a time domain error associated with the first sub-converter only, a second filtering coefficient of the first set of filtering coefficients being determined based at least partially on the time domain error associated with the first sub-converter and a weighted average of the time domain error associated with the first sub-converter and a time domain error associated with the second sub-converter.

2. The device of claim 1, wherein the first filtering coefficients is determined based on:

$$f_{ni} = f_{ni} - \gamma \cdot err_n \cdot y_{ni},$$

where $f_{ni}$ denotes the filtering coefficient of an ith filtering tap of the first set of filtering taps dedicated to the first sub-converter, $err_n$ denotes the time domain error associated with the first sub-converter, $y_{ni}$ denotes an input to the ith filtering tap, n denotes a nth sub-converter, and $\gamma$ is a constant.

3. The device of claim 1, wherein the second filtering coefficient is determined at least partially based on:

$$f_{nj} = f_{nj} - \gamma \cdot \left( err_n \cdot y_{nj} - \frac{\sum_{n=1}^{N} err_n \cdot y_{nj}}{N} \right),$$

wherein $f_{nj}$ denotes a filtering coefficient of an jth filtering tap of the first set of filtering taps dedicated to the first sub-converter, $err_n$ denotes a time domain error associated with a nth sub-converter, $y_{nj}$ denotes an input to an jth filtering tap of filtering taps dedicated to the nth sub-converter, N denotes a number of sub-converters, n denotes a nth sub-converter, and $\gamma$ is a constant.

4. The device of claim 1, wherein the second filtering coefficient is determined at least partially based on:

$$f_{nj} = f_{nj} - \gamma \cdot err_n \cdot y_{nj} - \left( \frac{\sum_{n=1}^{N} f_{nj}}{N} - m_j - \gamma \cdot \frac{\sum_{n=1}^{N} (2 \cdot err_n \cdot y_{nj})}{N} \right),$$

wherein $f_{nj}$ denotes a filtering coefficient of an jth filtering tap of filtering taps dedicated to an nth sub-converter, $err_n$ denotes a time domain error associated with the nth sub-converter, $y_{nj}$ denotes an input to the jth filtering tap, $m_j$ is a constant, N denotes a number of sub-converters, n denotes a nth sub-converter, and $\gamma$ is a constant.

5. The device of claim 1, wherein the second filtering coefficient is determined at least partially based on:

$$\frac{\sum_{n=1}^{N} f_{nj}}{N} = m_j,$$

wherein $f_{nj}$ denotes a filtering coefficient of an jth filtering tap of filtering taps dedicated to an nth sub-converter, N denotes a number of sub-converters, n denotes a nth sub-converter, and $m_j$ is a constant.

6. The device of claim 1, wherein the second filtering coefficient includes only one filtering coefficient.

7. The device of claim 1, wherein the second filtering coefficient includes a filtering coefficient for a center filtering tap of the first set of filtering taps.

8. The device of claim 1, wherein the second set of filtering coefficients include a third filtering determined based on a time domain error associated with the second sub-converter only.

9. The device of claim 1, wherein a filtering coefficient of an nth filtering tap of the first set of filtering taps dedicated to the first sub-converter is different from a filtering coefficient of an nth filtering tap of the second set of filtering taps dedicated to the second sub-converter.

10. A device, comprising:
a time interleaved analog to digital converter (ADC) having:
an input terminal configured to receive an analog input signal;
a first sub-converter coupled to the input terminal and configured to sample the analog input signal and convert a first set of samples of the analog input signal into a first set of digital output values;
a second sub-converter coupled to the input terminal and configured to sample the analog input signal and convert a second set of samples of the analog input signal into a second set of digital output values;
a first finite impulse response (FIR) filter coupled to an output of the first sub-converter, the first FIR filter having a first set of filtering coefficients of a first set of filtering taps; and
a second FIR filter coupled to an output of the second sub-converter, the second FIR filter having a second set of filtering coefficients of a second set of filtering taps, the filtering coefficients of the second set being different from the filtering coefficients of the first set;
wherein at least one filtering coefficient of the first FIR filter is determined based at least partially on a time domain error associated with the first sub-converter and a first weighted average of the time domain error associated with the first sub-converter and a time domain error associated with the second sub-converter; and
at least one filtering coefficient of the second FIR filter is determined based at least partially on the time domain error associated with the second sub-converter and a second weighted average of the time domain error associated with the first sub-converter and the time domain error associated with the second sub-converter.

11. The device of claim 10, wherein at least one filtering coefficient of the first FIR filter is determined based on the time domain error associated with the first sub-converter only and at least one filtering coefficient of the second FIR filter is determined based on the time domain error associated with the second sub-converter only.

12. An analog-to-digital converting method, comprising:
sampling an analog signal using a time interleaved analog-to-digital converting circuit that includes a first sub-converter and a second sub-converter to generate a first digital output by the first sub-converter and a second digital output by the second sub-converter;
processing the first digital output and the second digital output using a finite impulse response (FIR) digital filtering unit, the FIR digital filtering unit having a first set of filtering coefficients of a first set of filtering taps dedicated to the first sub-converter and a second set of filtering coefficients of a second set of filtering taps dedicated to the second sub-converter, the first set of filtering coefficients including a first filtering coefficient of an nth filtering tap in the first set of filtering taps and the second set of filtering coefficients including a second filtering coefficient, of an nth filtering tap in the second set of filtering taps, the second filtering coefficient being different from the first filtering coefficient; and
generating a digital signal by combining processing outputs of the FIR digital filtering unit;
wherein the first filtering coefficient is determined based on:

$$f_{ni} = f_{ni} - \gamma \cdot err_n \cdot y_{ni},$$

wherein $f_{ni}$ denotes the filtering coefficient of an ith filtering tap of the first set of filtering taps dedicated to the first sub-converter, $err_n$ denotes the time domain error associated with the first sub-converter, $y_{ni}$ denotes an input to the ith filtering tap, n denotes a nth sub-converter, and $\gamma$ is a constant.

13. The method of claim 12, wherein the second filtering coefficient is determined based on a time domain error associated with the second sub-converter only.

14. The device of claim 12, wherein:
the first filtering coefficient is determined based at least partially on a time domain error associated with the first sub-converter and a first weighted average of the time domain error associated with the first sub-converter and a time domain error associated with the second sub-converter; and
the second filtering coefficient is determined based at least partially on the time domain error associated with the second sub-converter and a second weighted average of the time domain error associated with the first sub-converter and the time domain error associated with the second sub-converter.

15. The method of claim 14, wherein the first filtering coefficient is determined at least partially based on:

$$f_{nj} = f_{nj} - \gamma \cdot \left( err_n \cdot y_{nj} - \frac{\sum_{n=1}^{N} err_n \cdot y_{nj}}{N} \right),$$

wherein $f_{nj}$ denotes a filtering coefficient of an jth filtering tap of the first set of filtering taps dedicated to the first sub-converter, $err_n$ denotes a time domain error associated with a nth sub-converter, $y_{nj}$ denotes an input to an jth filtering tap of filtering taps dedicated to the nth sub-converter, N denotes a number of sub-converters, n denotes a nth sub-converter, and $\gamma$ is a constant.

16. The method of claim 14, wherein the first filtering coefficient is determined at least partially based on:

$$f_{nj} = f_{nj} - \gamma \cdot err_n \cdot y_{nj} - \left( \frac{\sum_{n=1}^{N} f_{nj}}{N} - m_j - \gamma \cdot \frac{\sum_{n=1}^{N} (2 \cdot err_n \cdot y_{nj})}{N} \right),$$

wherein $f_{nj}$ denotes a filtering coefficient of an jth filtering tap of filtering taps dedicated to an nth sub-converter, $err_n$ denotes a time domain error associated with the nth sub-converter, $y_{nj}$ denotes an input to the jth filtering tap, $m_j$ is a constant, N denotes a number of sub-converters, n denotes a nth sub-converter, and $\gamma$ is a constant.

17. The method of claim 14, wherein the first filtering coefficient is determined at least partially based on:

$$\frac{\sum_{n=1}^{N} f_{nj}}{N} = m_j,$$

wherein $f_{nj}$ denotes a filtering coefficient of an jth filtering tap of filtering taps dedicated to an nth sub-converter, N denotes a number of sub-converters, n denotes a nth sub-converter, and $m_j$ is a constant.

* * * * *